United States Patent
Azin et al.

(10) Patent No.: US 9,391,569 B2
(45) Date of Patent: Jul. 12, 2016

(54) MULTI-STAGE SWITCHED-CAPACITOR DC BLOCKING CIRCUIT FOR AUDIO FRONTEND

(71) Applicant: QUALCOMM Incorporated, San Diego, CA (US)

(72) Inventors: Meysam Azin, San Diego, CA (US); Arash Mehrabi, San Diego, CA (US); Wenchang Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 14/230,909

(22) Filed: Mar. 31, 2014

(65) Prior Publication Data

US 2015/0280660 A1   Oct. 1, 2015

(51) Int. Cl.
| | |
|---|---|
| H03F 1/02 | (2006.01) |
| H03F 3/185 | (2006.01) |
| H03F 3/45 | (2006.01) |
| H03F 3/00 | (2006.01) |
| H03F 3/181 | (2006.01) |
| H03F 3/187 | (2006.01) |
| H03H 19/00 | (2006.01) |
| H04R 3/00 | (2006.01) |

(52) U.S. Cl.
CPC ............... *H03F 3/185* (2013.01); *H03F 3/005* (2013.01); *H03F 3/181* (2013.01); *H03F 3/187* (2013.01); *H03F 3/45179* (2013.01); *H03F 3/45183* (2013.01); *H03H 19/004* (2013.01); *H03F 2200/03* (2013.01); *H03F 2203/45016* (2013.01); *H03F 2203/45514* (2013.01); *H04R 3/00* (2013.01)

(58) Field of Classification Search
CPC .................................. H03F 1/02; H03F 3/005
USPC ............................... 330/9, 107, 109; 327/124
See application file for complete search history.

(56) References Cited

U.S. PATENT DOCUMENTS

| | | | | |
|---|---|---|---|---|
| 4,496,858 | A | * | 1/1985 | Smith ........................... 327/102 |
| 4,633,425 | A | | 12/1986 | Senderowicz |
| 6,035,049 | A | | 3/2000 | Engh et al. |

(Continued)

FOREIGN PATENT DOCUMENTS

GB        2308684 A        7/1997

OTHER PUBLICATIONS

Daniel C. Von Grunigen et al., "Integrated Switched-Capacitor Low-Pass Filter with Combined Anti-Aliasing Decimation Filter for Low Frequencies", IEEE Journal of Solid-State Circuits, vol. SC-17, No. 6, Dec. 1, 1982, pp. 1024-1029, XP002619996.

(Continued)

*Primary Examiner* — Steven J Mottola
(74) *Attorney, Agent, or Firm* — Patterson Sheridan, LLP

(57) ABSTRACT

An integrated DC blocking amplifier circuit, including: an operational amplifier configured in a differential amplifier; and at least first and second two-stage switched-capacitor circuits, each two stage switched-capacitor circuit including a first-stage circuit and a second-stage circuit, wherein the first two-stage switched capacitor circuit is connected to a positive side feedback path of the operational amplifier and the second two-stage switched capacitor circuit is connected to a negative side feedback path of the operational amplifier, wherein the first-stage circuit is switched at a relatively low switching frequency, while the second-stage circuit is switched at a relatively high switching frequency.

18 Claims, 7 Drawing Sheets

(56) References Cited

U.S. PATENT DOCUMENTS

| | | | |
|---|---|---|---|
| 6,124,814 A | 9/2000 | Lee et al. | |
| 6,778,009 B1 * | 8/2004 | Lee | 330/9 |
| 8,441,384 B2 | 5/2013 | Lai et al. | |
| 8,482,338 B1 | 7/2013 | Dasgupta et al. | |
| 8,638,165 B2 * | 1/2014 | Shah et al. | 330/9 |
| 2012/0306575 A1 | 12/2012 | Shah et al. | |

OTHER PUBLICATIONS

International Search Report and Written Opinion—PCT/US2015/017697—ISA/EPO—Jun. 18, 2015.

Ouslis C., et al., "Multi-rate switched capacitor filter design with aggressive sampling-rates: filtorX in action", Proceedings of the International Symposium on Circuits and Systems. San Diego, May 10-13, 1992; [Proceedings of the International Symposium on Circuits and Systems, ISCAS)], New York, IEEE, US, vol. 3, May 3, 1992, pp. 1183-1186, XP010061435.

Python D., et al., "A Micropower Class-AB CMOS Log-Domain Filter for DECT Applications", IEEE Journal of Solid-State Circuits, IEEE Service Center, Piscataway, NJ, USA, vol. 36, No. 7, Jul. 1, 2001, XP011061550, pp. 1067-1075.

* cited by examiner

MULTI-STAGE SWITCHED-CAPACITOR DC BLOCKING CIRCUIT FOR AUDIO FRONTEND

BACKGROUND

1. Field

This invention relates to DC blocking amplifiers, and more specifically, to multi-stage switched-capacitor DC blocking amplifiers.

2. Background

There is an increasing demand to provide high quality audio and video from a variety of user devices. For example, handheld devices are now capable of rendering high definition video and outputting high quality multichannel audio. Such devices typically require audio amplifiers that are designed to provide high quality signal amplification.

In a typical device implementation, an integrated amplifier with high-pass filtering is provided for audio applications. For example, the high-pass filtering removes DC components from a microphone input signal before amplification. The high-pass filtering may utilize DC blocking capacitors to reduce the cost and circuit board area of the system.

SUMMARY

In one embodiment, an integrated DC blocking amplifier circuit is disclosed. The integrated DC blocking amplifier circuit includes: an operational amplifier configured in a differential amplifier mode; and at least first and second two-stage switched-capacitor circuits, each two stage switched-capacitor circuit including a first-stage circuit and a second-stage circuit, wherein the first two-stage switched capacitor circuit is connected to a positive side feedback path of the operational amplifier and the second two-stage switched capacitor circuit is connected to a negative side feedback path of the operational amplifier, wherein the first-stage circuit is switched at a relatively low switching frequency, while the second-stage circuit is switched at a relatively high switching frequency.

In another embodiment, a method for driving a two-stage switched-capacitor circuit in an integrated circuit of a DC blocking amplifier is disclosed. The method includes: determining a first sampling frequency of a first stage of the two-stage switched capacitor circuit to be above a minimum sampling rate for an audio signal, but at a relatively low frequency; determining a second sampling frequency of a second stage of the two-stage switched capacitor circuit to be above a minimum sampling rate for an audio signal, but at a relatively high frequency; driving the first stage and the second stages at the first sampling frequency and the second sampling frequency, respectively.

In yet another embodiment, an apparatus for driving a two-stage switched-capacitor circuit in an integrated circuit of a DC blocking amplifier is disclosed. The apparatus includes: means for determining a first sampling frequency of a first stage of the two-stage switched capacitor circuit to be above a minimum sampling rate for an audio signal, but at a relatively low frequency; means for determining a second sampling frequency of a second stage of the two-stage switched capacitor circuit to be above a minimum sampling rate for an audio signal, but at a relatively high frequency; means for driving the first stage and the second stages at the first sampling frequency and the second sampling frequency, respectively.

In yet another embodiment, an apparatus for driving a two-stage switched-capacitor circuit in an integrated circuit of a DC blocking amplifier is disclosed. The apparatus generally includes means for determining a first sampling frequency of a first stage of the two-stage switched-capacitor circuit to be above a minimum sampling rate for an audio signal, but at a relatively low frequency; means for determining a second sampling frequency of a second stage of the two-stage switched-capacitor circuit to be above a minimum sampling rate for an audio signal, but at a relatively high frequency; means for driving the first stage above a minimum sampling rate for an audio signal, but at a relatively low frequency; and means for driving the second stage above a minimum sampling rate for an audio signal, but at a relatively high frequency.

Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

As described above, in a typical device implementation, an integrated amplifier with high-pass filtering is provided for audio applications to remove DC components from a microphone input signal before amplification. The high-pass filtering may utilize a single-stage DC blocking switched-capacitor circuit and passive anti-aliasing filters. However, a single-stage switched-capacitor circuit has poor alias rejection and linearity at low frequency. Further, passive anti-aliasing filters are large, costly, and can introduce noise.

Certain embodiments as described herein provide for a DC blocking amplifier including: (1) a multi-stage switched-capacitor circuit with a different switching clock frequency for each stage; and (2) a plurality of active aliasing filters to generate large resistance with small parasitic capacitance. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

Figure 1:
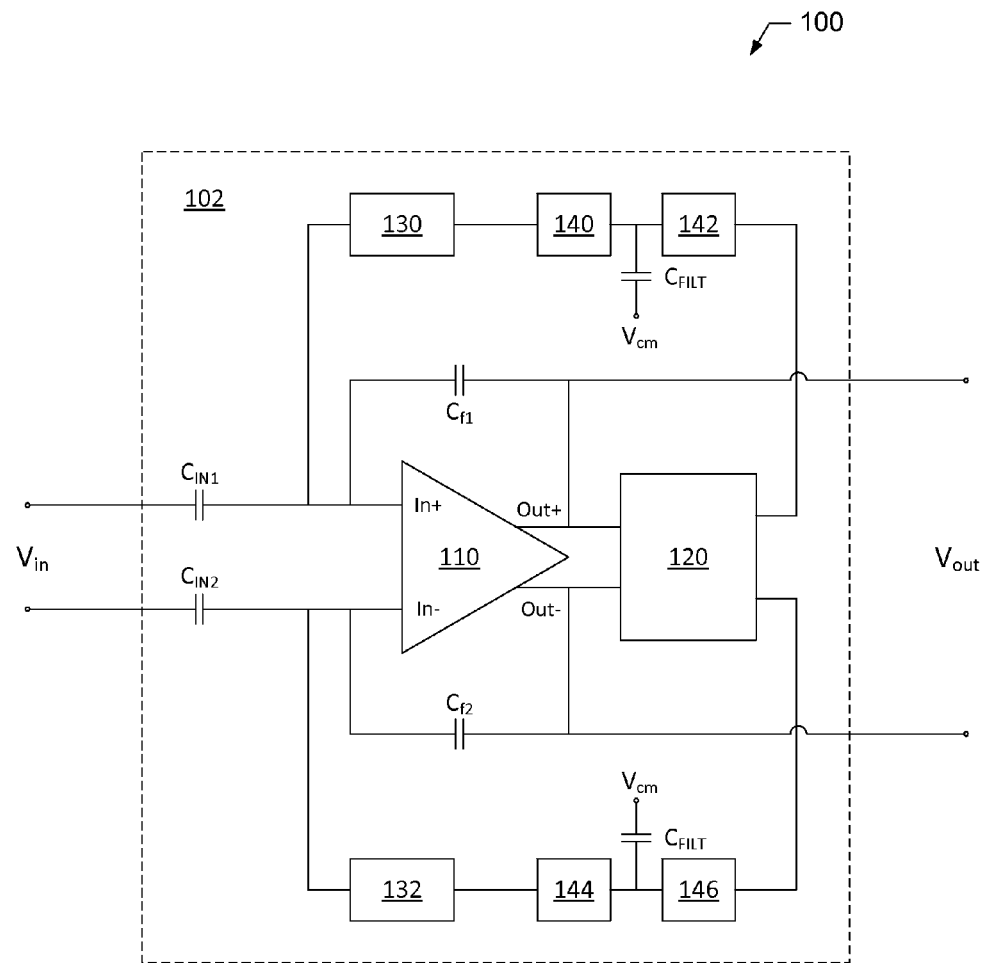
FIG. 1 is a functional block diagram illustrating a DC blocking amplifier circuit in accordance with one embodiment of the present invention.

FIG. 1 is a functional block diagram illustrating a DC blocking amplifier circuit 100 in accordance with one embodiment of the present invention. The DC blocking amplifier circuit 100 comprises an integrated circuit 102 that may include an operational amplifier 110 and DC blocking capacitors, $C_{IN1}$, $C_{IN2}$. The DC blocking capacitors may be placed inside the integrated circuit 102 to reduce the cost and board area of the circuit.

The integrated circuit 102 may be configured as a differential amplifier comprising two, two-stage switched-capacitor circuits 140, 142 and 144, 146 with a different switching clock frequency for each stage. In the illustrated embodiment of FIG. 1, the two-stage switched-capacitor circuits 140, 142 and 144, 146 may be connected into the feedback paths of the operational amplifier 110. The integrated circuit 102 may also include optional anti-aliasing filters 120, 130, 132. In one embodiment, the anti-aliasing filters 130, 132 may be configured as active filters to generate large on-chip resistance with small parasitic capacitance. It should be noted that while the operational amplifier 110 is shown as a differential amplifier in FIG. 1, the circuit may be configured for use with a single-ended amplifier.

Figure 2:
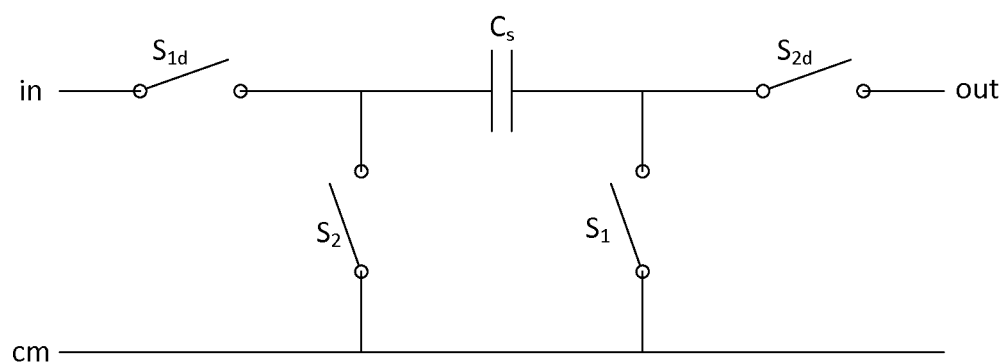
FIG. 2 is an example of a first-stage switched-capacitor circuit.

In the illustrated embodiment of FIG. 1, the two-stage switched-capacitor circuit 140, 142 may be connected to the positive side feedback path of the operational amplifier 110. In one embodiment, an example of the first-stage switched-capacitor circuit 140 is shown in FIG. 2. The second-stage switched-capacitor circuit 142 may be configured substantially similarly to the first-stage circuit 140 shown in FIG. 2. However, the switches of the first-stage switched-capacitor circuit 140 may be switched at a relatively low frequency (e.g., 48 KHz) to limit noise, while the switches of the second-stage switched-capacitor circuit 142 may be switched at a relatively high frequency (e.g., 192 KHz) to limit aliasing.

When sampling a signal, reconstruction of the signal without aliasing may be possible when the sampling frequency is greater than twice the maximum frequency of the sampled signal. If lower sampling rates are used, the information of the original signal may not be completely recoverable from the sampled signal. Since the full range of human hearing is between 20 Hz and 20 kHz, the minimum sampling rate that satisfies the sampling requirement for the full bandwidth may be 40 kHz. In digital audio, the most common sampling rates are 44.1 kHz, 48 kHz, 88.2 kHz, 96 kHz and 192 kHz.

As described above, the sampling frequency (e.g., 48 KHz) of the first stage may be selected to satisfy at least the minimum sampling requirement (i.e., 40 KHz) for doubling of the full audio bandwidth. Further, in one embodiment, the switches of the second-stage switched-capacitor circuit 142 may be switched at a relatively high frequency (e.g., 192 KHz) to limit aliasing. In operation, the input of the switched-capacitor circuit 140 may be selectively connected to a virtual ground (cm) by switches $S_1$ and $S_2$, thus substantially reducing the signal swing and also any aliasing and distortion.

Referring back to FIG. 1, the output of the switched-capacitor circuit 140 may still be subjected to the signal swing, which may be reduced by adding a capacitor ($C_{FILT}$). One terminal of the capacitor $C_{FILT}$ may be connected to the output the circuit 140, while the other terminal may be connected to the common mode or signal ground. Capacitors $C_{f1}$, $C_{f2}$ may be added to the positive side and negative side feedback paths of the operational amplifier 110, respectively, to control the corner frequency of the high-pass filter.

The second-stage switched-capacitor circuit 142 may operate in a similar fashion to the first-stage switched-capacitor circuit 140 (see FIG. 2) by selectively connecting the input to the virtual ground (cm) to substantially reduce the signal swing and also any aliasing and distortion at the input of the switched-capacitor circuit 142. The output of the switched-capacitor circuit 142 may still be subjected to the signal swing at the output of the operational amplifier 110, but as this is away from the input, the aliasing concern may be addressed by adding an optional anti-aliasing filter 120. Further, by having a two-stage switched-capacitor configuration with two different switching frequencies, the area of the anti-aliasing filter 120 may be substantially reduced.

In the illustrated embodiment of FIG. 1, another two-stage switched-capacitor circuit 144, 146 may be connected to the negative side feedback path of the operational amplifier 110. In one embodiment, the switched-capacitor circuits 144, 146 may be configured substantially similarly to the switched-capacitor circuit 140 illustrated in FIG. 2. Again, the switches of the first-stage switched-capacitor circuit 144 may be switched at a relatively low frequency (e.g., 48 KHz) to limit noise, while the switches of the second-stage switched-capacitor circuit 146 may be switched at a relatively high frequency (e.g., 192 KHz) to limit aliasing. As described above, the switching frequency (e.g., 48 KHz) of the first stage may be selected to satisfy at least the minimum sampling requirement (i.e., 40 KHz) for doubling of the full audio bandwidth. Further, the switches of the second-stage switched-capacitor circuit 146 may be switched at a relatively high frequency (e.g., 192 KHz) to limit aliasing.

If the operational amplifier 110 is ideal and has infinite gain and bandwidth there may be no adverse effect due to aliasing of signals at its input because there will be zero swing at all frequencies. In reality, the operational amplifier 110 has a finite gain bandwidth product, and therefore, for high frequencies, the loop gain drops. Accordingly, if there are substantial high-frequency components present in the input signal, these high-frequency components may cause some amount of signal swing across the virtual grounds. If the high-frequency components are sufficiently close in frequency to multiples of the sampling frequency, the switched-capacitor circuits 140, 142, 144, 146 may alias these down into the frequency band of interest. According to certain aspects, in order to reduce the aliasing of high frequency signals sampled at the input of the operational amplifier 110, in one embodiment, the optional anti-aliasing filters 130, 132 may be placed at the input before the switched-capacitor circuits 140, 142 and 144, 146, respectively.

Figure 3:
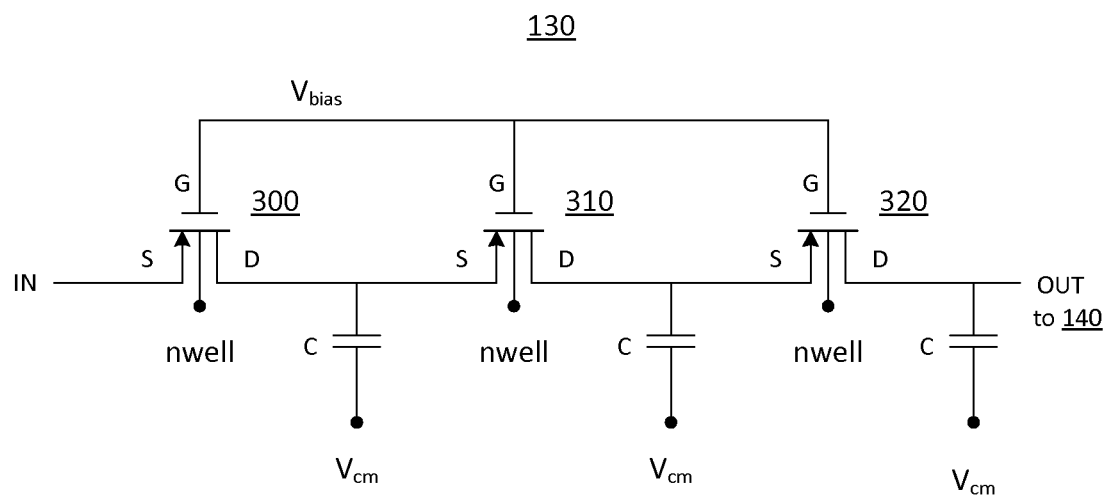
FIG. 3 is a schematic diagram of an input aliasing filter configured with active elements to generate large resistance with small parasitic capacitance in accordance with one embodiment of the present invention.

FIG. 3 is a schematic diagram of an input aliasing filter 130 configured with active elements to generate large resistance with small parasitic capacitance in accordance with one embodiment of the present invention. As described above, the anti-aliasing filter 130 may reduce the aliasing of high frequency signals sampled at the input of the operational amplifier 110. Further, the configuration of the anti-aliasing filter 130 with active elements may enable the area of the output anti-aliasing filter 120 to be reduced even further (i.e., further reduction in chip area to the reduction due to the configuration of the two-stage switched-capacitor circuits with two different switching frequencies).

In the illustrated embodiment of FIG. 3, the anti-aliasing filter 130 may include three p-type, metal-oxide semiconductor field-effect transistors (e.g., P-MOSFETs or PMOS transistors) 300, 310, 320 with gate terminals connected to a bias voltage ($V_{bias}$) and body terminals connected to n-wells. Further, the source terminal of PMOS transistor 300 may be connected to the virtual ground of the operational amplifier 110, the drain terminal of PMOS transistor 300 may be connected to the source terminal of PMOS transistor 310, the drain terminal of PMOS transistor 310 may be connected to the source terminal of PMOS transistor 320, and the drain terminal of PMOS transistor 320 may be connected to the input of the switched-capacitor 140. According to certain aspects, to reduce the out signal swing of PMOS transistors 300, 310, 320, capacitors may be added at the drain terminals and the capacitors may also be connected to the virtual ground. Although the anti-aliasing filter 130 may be configured with three PMOS transistors, the filter 130 may be configured with any number of p-type or n-type MOSFETs appropriately connected to provide similar anti-aliasing functions.

Figure 4:
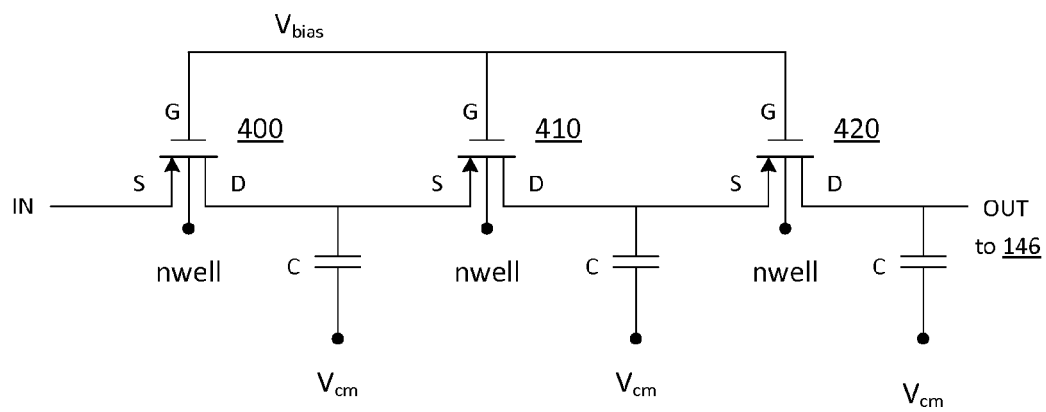
FIG. 4 is a schematic diagram of an input aliasing filter configured with active elements to generate large resistance with small parasitic capacitance in accordance with one embodiment of the present invention.

FIG. 4 is a schematic diagram of an input aliasing filter 132 that may be configured with active elements to generate large resistance with small parasitic capacitance in accordance with one embodiment of the present invention. As described above, the anti-aliasing filter 132 may reduce the aliasing of high frequency signals sampled at the input of the operational amplifier 110. Further, the configuration of the anti-aliasing filter 132 as an active element may enable the area of the output anti-aliasing filter 120 to be reduced even further (i.e., further reduction in chip area to the reduction due to the configuration of the two-stage switched-capacitor circuits with two different switching frequencies).

In the illustrated embodiment of FIG. 4, the anti-aliasing filter 132 may include three PMOS transistors 400, 410, 420 with gate terminals connected to a bias voltage ($V_{bias}$) and body terminals connected to n-wells. Further, according to certain aspects, the source terminal of PMOS transistor 400 may be connected to the virtual ground of the operational amplifier 110, the drain terminal of PMOS transistor 400 may be connected to the source terminal of PMOS transistor 410, the drain terminal of PMOS transistor 410 may be connected to the source terminal of PMOS transistor 420, and the drain terminal of PMOS transistor 420 may be connected to the input of the switched-capacitor 146. To reduce the out signal swing of PMOS transistors 400, 410, 420, capacitors may be added at the drain terminals and the capacitors may also be connected to the virtual ground. Although the anti-aliasing filter 132 may be configured with three PMOS transistors, the filter 132 may be configured with any number of p-type or n-type MOSFETs appropriately connected to provide similar anti-aliasing functions.

Figure 5:
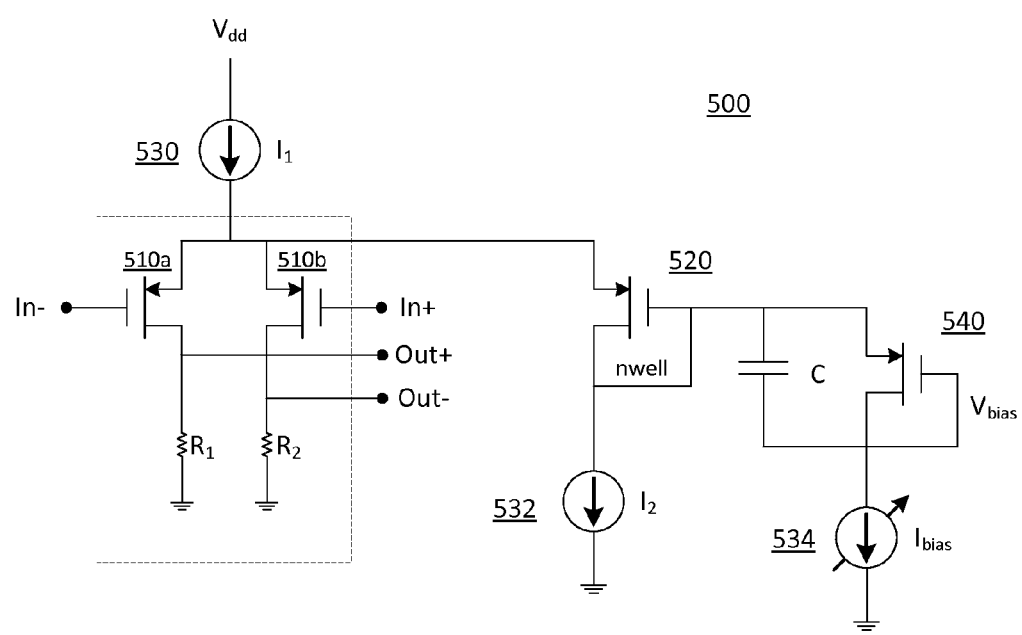
FIG. 5 is a schematic diagram of a PMOS circuit which resides partially in the anti-aliasing filter and partially in the anti-aliasing filter in accordance with one embodiment of the present invention.

FIG. 5 is a schematic diagram of a PMOS circuit 500 which may reside in the operational amplifier 110 in accordance with one embodiment of the present invention. In another embodiment, the PMOS circuit 500 shown in FIG. 5 may reside partially in the anti-aliasing filter 130 and partially in the anti-aliasing filter 132. Thus, elements for anti-aliasing filters 130, 132 may be placed into a common area of the integrated circuit 102.

In the illustrated embodiment of FIG. 5, two PMOS transistors 510a, 510b may constitute the first stage differential amplifier and may reside within the operational amplifier 110 (see FIG. 1). The gate terminal of PMOS transistor 510a may be the In− (negative) terminal of the operational amplifier 110, while the gate terminal of PMOS transistor 510b may be the In+ (positive) terminal of the operational amplifier 110. The source terminals of PMOS transistors 510a, 510b may be connected to the current source 530, which may also connect to the supply voltage ($V_{dd}$). The drain terminals of PMOS transistors 510a, 510b may be connected to load resistors R1 and R2, respectively. Additionally or alternatively, the load resistors may be configured with transistors. The source terminals of PMOS transistors 510a, 510b may also be connected to the source terminal of PMOS transistor 520, whose drain terminal may be connected to another current source 532. The drain terminal of PMOS transistor 520 may also connect to the gate terminal of PMOS transistor 520 which may both be connected to the n-well. The current source 532 may generate current $I_2$. In one embodiment, the size of PMOS transistor 520 may be configured to be smaller than each of PMOS transistors 510a, 510b by a factor of M. The current source 530 may generate current $I_1$ which is (2*M+1) times current $I_2$ generated by the current source 532. Thus, in one embodiment, when M is set to 6 and $I_2$ is 2.5 µA, current $I_1$ generated by the current source 530 is 32.5 µA.

According to certain aspects, alias rejection may cause harmonic distortion to increase. To control the harmonic distortion during the anti-aliasing process, another PMOS transistor 540 with a variable current source 534 may be added. The gate terminal of PMOS transistor 520 may be connected to the source terminal of PMOS transistor 540, whose gate and drain terminals connect to a variable current source 534 that may generate a bias current ($I_{bias}$). This bias current may control the trade-off between the harmonic distortion and the alia rejection. An optional capacitor C may be connected between source and drain terminals of PMOS transistor 540. In another embodiment, the circuit 500 may be configured with N-type MOSFETs as shown in FIG. 6.

Figure 6:
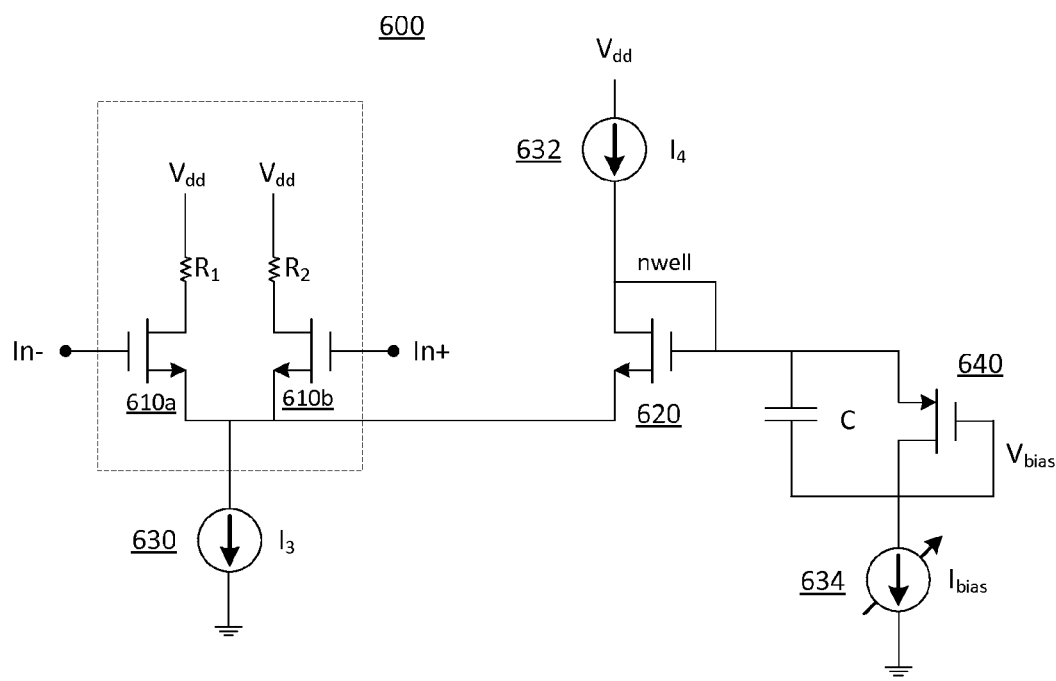
FIG. 6 is a schematic diagram of an NMOS circuit which can reside partially in the anti-aliasing filter and partially in the anti-aliasing filter in accordance with another embodiment of the present invention.

FIG. 6 is a schematic diagram of an NMOS circuit 600 which may reside in the operational amplifier 110 in accordance with another embodiment of the present disclosure. As with the PMOS circuit 500, in an alternative embodiment, the NMOS circuit 600 shown in FIG. 6 may reside partially in the anti-aliasing filter 130 and partially in the anti-aliasing filter 132.

In the illustrated embodiment of FIG. 6, two NMOS transistors 610a, 610b may constitute the first stage differential amplifier residing within the operational amplifier 110 (see FIG. 1). The gate terminal of NMOS transistor 610a may be the In− (negative) terminal of the operational amplifier 110, while the gate terminal of NMOS transistor 610b may be the In+ (positive) terminal of the operational amplifier 110. The drain terminals of NMOS transistors 610a, 610b may be connected to the supply voltage ($V_{dd}$), while the source terminals of NMOS transistors 610a, 610b may be connected to the current source 630 which may also connect to the ground voltage. The drain terminals of NMOS transistors 610a, 610b may be connected to load resistors R1 and R2, respectively. In the alternative, the load resistors may be configured with transistors. The source terminals of NMOS transistors 610a, 610b may also be connected to the source terminal of NMOS transistor 620, whose drain terminal may be connected to another current source 632. The drain terminal of NMOS transistor 620 may also connect to the gate terminal of NMOS transistor 620 which are both connected to the n-well. The current source 632 may generate current $I_2$. In one embodiment, the size of NMOS transistor 620 may be configured to be smaller than each of NMOS transistors 610a, 610b by a factor of M. The current source 630 may generate current $I_3$ which is (2*M+1) times current $I_4$ generated by the current source 632. Thus, in one embodiment, when M is set to 6 and $I_4$ is 2.5 µA, current $I_3$ generated by the current source 630 is 32.5 µA.

According to certain aspects, to control the harmonic distortion during the anti-aliasing process, PMOS transistor 640 with a variable current source 634 may be added. The gate terminal of NMOS transistor 620 may be connected to the source terminal of PMOS transistor 640, whose gate and drain terminals may connect to a current source 634 that generates a bias current ($I_{bias}$). This bias current may control the trade-off between the harmonic distortion and the alia rejection. As before, an optional capacitor C may be connected between source and drain terminals of PMOS transistor 640.

Figure 7:
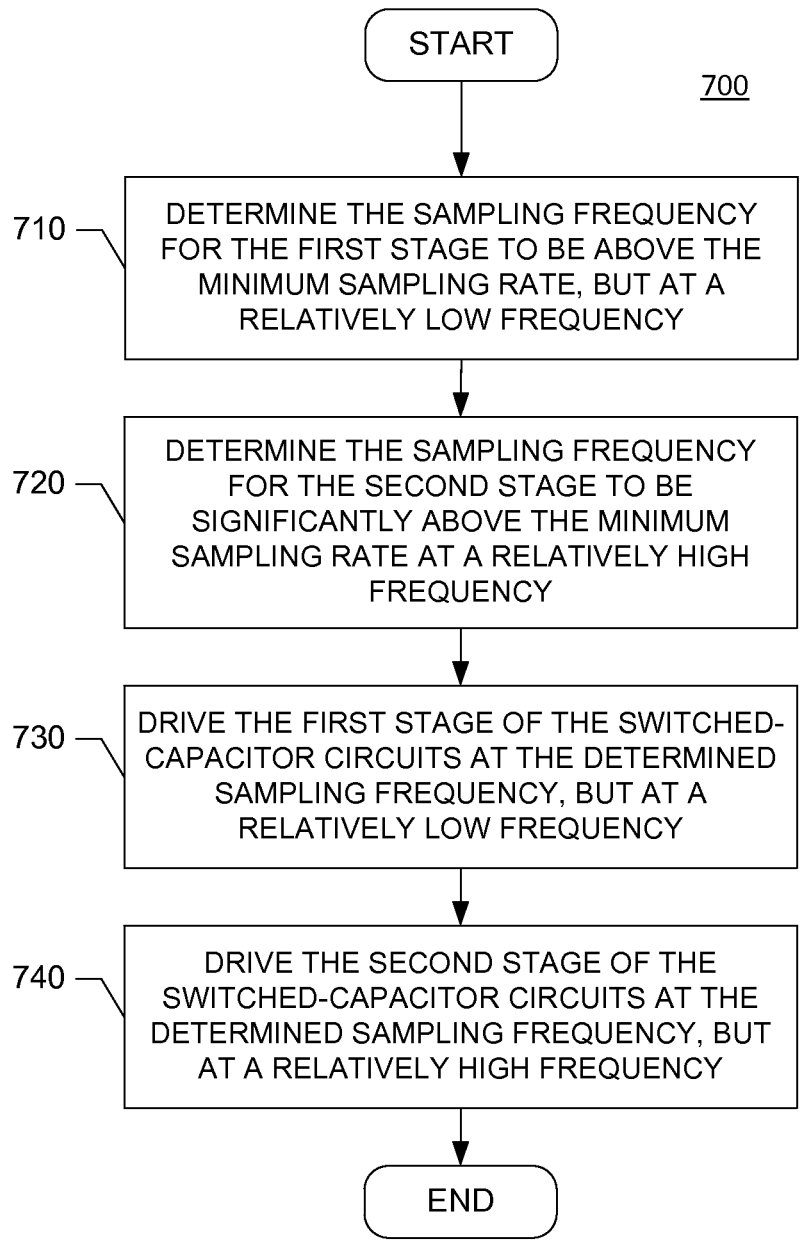
FIG. 7 is a flow diagram for driving a two-stage switched-capacitor circuit in an integrated circuit of a DC blocking amplifier in accordance with one embodiment of the present invention.

FIG. 7 is a flow diagram 700 for driving a two-stage switched-capacitor circuit in an integrated circuit of a DC blocking amplifier in accordance with one embodiment of the present invention. Initially, a sampling frequency of each stage of the two-stage switched-capacitor circuit may be determined. In determining the sampling frequency of the first stage, reconstruction of a signal (that is being sampled) without aliasing may be considered. For example, in sampling an audio signal, since the bandwidth is approximately 20 KHz, the minimum sampling rate that may satisfy the sampling requirement for the full bandwidth is 40 kHz. Therefore, the first stage sampling frequency may be determined, at step 710, to be above the minimum sampling rate, but at a relatively low frequency (e.g., within 10-30% above the minimum sampling rate of 40 KHz, that is, 44 to 52 KHz) to limit noise. In one embodiment, the first stage sampling frequency may be determined to be 48 KHz, or 20% above the minimum sampling rate. Further, the second stage sampling frequency may be determined, at step 720, to be significantly above the minimum sampling rate at a relatively high frequency (e.g., four times the sampling rate of the first stage) to reduce or limit aliasing. In one embodiment, the second stage sampling frequency may be determined to be 192 KHz, or four times the sampling frequency of the first stage. Thus, one additional stage of the switched-capacitor circuit may enable isolation of input and output switching frequencies. Further, since the additional stage may increase the corner frequency of the output anti-aliasing filter (e.g., filter 120 in FIG. 1) by a factor of about 10, the area of the anti-aliasing filter may be reduced by a factor of about 3.2 ($=1/\sqrt{10}$). Accordingly, the first stage of the switched capacitor circuits may be driven, at step 730, at the determined sampling frequency above a minimum sampling rate for an audio signal, but at a relatively low frequency. The second stage of the switched capacitor circuits may be driven, at step 740, at the determined sampling frequency above a minimum sampling rate for an audio signal, but at a relatively high frequency.

Although several embodiments of the invention are described above, many variations of the invention are possible. For example, although the illustrated embodiments use a two-stage switched-capacitor circuit, the switched-capacitor circuit may be configured into any number of stages. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. An integrated DC blocking amplifier circuit, comprising:

an operational amplifier configured in a differential amplifier mode and having at least a positive input and a negative input; and at least first and second two-stage switched-capacitor circuits, each two stage switched-capacitor circuit including a first-stage circuit and a second-stage circuit, wherein the first-stage circuit and the second-stage circuit of the first two stage switched-capacitor and the second two stage switched-capacitor each comprises an input and an output, wherein the output of the first-stage circuit of the first two stage switched-capacitor circuit is connected to the input of the second-stage circuit of the first two stage switched-capacitor circuit and the output of the first-stage circuit of the second two stage switched-capacitor circuit is connected to the input of the second-stage circuit of the second two stage switched-capacitor, wherein the first two-stage switched capacitor circuit is connected to a positive side feedback path of the operational amplifier and the second two-stage switched capacitor circuit is connected to a negative side feedback path of the operational amplifier, wherein the first-stage circuit of the at least first and second two-stage switched-capacitor circuit is switched at a relatively low switching frequency, while the second-stage circuit of the at least first and second two-stage switched-capacitor circuit is switched at a relatively high switching frequency.

2. The integrated DC blocking amplifier circuit of claim 1, further comprising
at least first and second anti-aliasing filters configured with active elements,
wherein the first anti-aliasing filter is coupled to input of the first-stage circuit of the first two-stage switched-capacitor circuit, and
wherein the second anti-aliasing filter is coupled to the input of the first-stage circuit of the second two-stage switched-capacitor circuit.

3. The integrated DC blocking amplifier circuit of claim 2, wherein each anti-aliasing filter of the at least first and second anti-aliasing filters comprises
a plurality of p-type, metal-oxide semiconductor field-effect (PMOS) transistors.

4. The integrated DC blocking amplifier circuit of claim 3, wherein
gate terminals of the plurality of PMOS transistors are coupled to a bias voltage;
body terminals of the plurality of PMOS transistors are connected to n-wells;
a source terminal of a first PMOS transistor is connected to virtual ground of the operational amplifier;
a drain terminal of the first PMOS transistor is connected to a source terminal of a second PMOS transistor;
a drain terminal of the second PMOS transistor is connected to a source terminal of a third PMOS transistor; and
a drain terminal of the third PMOS transistor is connected to an input of the first-stage circuit.

5. The integrated DC blocking amplifier circuit of claim 4, further comprising
a plurality of capacitors, each capacitor coupled to the drain terminals of the first, second, and third PMOS transistors.

6. The integrated DC blocking amplifier circuit of claim 2, wherein the at least first and second anti-aliasing filters comprise
at least first and second PMOS transistors configured as a differential amplifier,
wherein a gate terminal of the first PMOS transistor is coupled to the positive input of the operational amplifier,
wherein a gate terminal of the second PMOS transistor is coupled to the negative input of the operational amplifier,
wherein source terminals of the at least first and second PMOS transistors are connected to a first end of a first current source with a second end connected to a supply voltage.

7. The integrated DC blocking amplifier circuit of claim 6, wherein the at least first and second anti-aliasing filters further comprise
a third PMOS transistor configured to be smaller in size than the at least first and second PMOS transistors,
wherein the source terminals of the at least first and second PMOS transistors are connected to a source terminal of the third PMOS transistor,
wherein a drain terminal and a gate terminal of the third PMOS transistor are connected with each other and to an n-well, and
wherein the drain terminal is connected to a first end of a second current source with a second end connected to ground.

8. The integrated DC blocking amplifier circuit of claim 7, wherein the size of the third PMOS transistor is smaller than the size of the at least first and second PMOS transistors by a pre-defined number which defines first current generated by the first current source to be two times the pre-defined number plus one multiplied by second current generated by the second current source.

9. The integrated DC blocking amplifier circuit of claim 7, wherein the at least first and second anti-aliasing filters further comprise
a fourth PMOS transistor including gate and drain terminals connected to each other and to a variable current source to generate a bias current,
wherein a source terminal of the fourth PMOS transistor is connected to the gate terminal of the third PMOS transistor.

10. The integrated DC blocking amplifier circuit of claim 1, wherein the relatively low switching frequency of the first-stage circuit is selected to be approximately 10 to 30% above a minimum sampling rate for an audio signal.

11. The integrated DC blocking amplifier circuit of claim 10, wherein the relatively high switching frequency of the second-stage circuit is selected to be a pre-defined multiple of the relatively low switching frequency of the first-stage circuit.

12. The integrated DC blocking amplifier circuit of claim 1, further comprising
at least first and second DC blocking capacitors disposed at an input to the integrated DC blocking amplifier circuit, the first DC blocking capacitor coupled to the positive input of the operational amplifier and the second DC blocking capacitor coupled to the negative input of the operation amplifier.

13. A method for driving a two-stage switched-capacitor circuit in an integrated circuit of a DC blocking amplifier, the method comprising:
determining a first sampling frequency of a first stage of the two-stage switched-capacitor circuit to be above a minimum sampling rate for an audio signal, but at a relatively low frequency;
determining a second sampling frequency of a second stage of the two-stage switched-capacitor circuit to be above a minimum sampling rate for an audio signal, but at a relatively high frequency;
driving the first stage above a minimum sampling rate for an audio signal, but at a relatively low frequency; and
driving the second stage above a minimum sampling rate for an audio signal, but at a relatively high frequency.

14. The method of claim 13, further comprising
selecting the relatively low switching frequency of the first stage to be approximately 10 to 30% above a minimum sampling rate for an audio signal.

15. The method of claim 14, further comprising
selecting the relatively high switching frequency of the second stage to be a pre-defined multiple of the relatively low switching frequency of the first stage.

16. An apparatus for driving a two-stage switched-capacitor circuit in an integrated circuit of a DC blocking amplifier, the apparatus comprising:
means for determining a first sampling frequency of a first stage of the two-stage switched-capacitor circuit to be above a minimum sampling rate for an audio signal, but at a relatively low frequency;
means for determining a second sampling frequency of a second stage of the two-stage switched-capacitor circuit to be above a minimum sampling rate for an audio signal, but at a relatively high frequency;

means for driving the first stage above a minimum sampling rate for an audio signal, but at a relatively low frequency; and means for driving the second stage above a minimum sampling rate for an audio signal, but at a relatively high frequency.

17. The apparatus of claim 16, wherein the means for determining a first sampling frequency comprises means for selecting the relatively low switching frequency of the first stage to be approximately 10 to 30% above a minimum sampling rate for an audio signal.

18. The apparatus of claim 17, wherein the means for determining a second sampling frequency comprises means for selecting the relatively high switching frequency of the second stage to be a pre-defined multiple of the relatively low switching frequency of the first stage.

\* \* \* \* \*